United States Patent
Wu et al.

(10) Patent No.: US 9,219,152 B2
(45) Date of Patent: Dec. 22, 2015

(54) SEMICONDUCTOR DEVICE WITH A BURIED STRESSOR

(71) Applicant: Taiwan Semiconductor Manufacturing Company, Ltd., Hsin-Chu (TW)

(72) Inventors: Zhiqiang Wu, Chubei (TW); Jeffrey Junhao Xu, Jhubei (TW); Chih-Hao Chang, Chu-Bei (TW); Wen-Hsing Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 13/658,348

(22) Filed: Oct. 23, 2012

(65) Prior Publication Data

US 2013/0043507 A1    Feb. 21, 2013

Related U.S. Application Data

(62) Division of application No. 12/750,160, filed on Mar. 30, 2010, now Pat. No. 8,338,259.

(51) Int. Cl.
| | | |
|---|---|---|
| *H01L 29/78* | (2006.01) | |
| *H01L 21/336* | (2006.01) | |
| *H01L 29/165* | (2006.01) | |
| *H01L 29/66* | (2006.01) | |

(52) U.S. Cl.
CPC ............ *H01L 29/785* (2013.01); *H01L 29/165* (2013.01); *H01L 29/6659* (2013.01); *H01L 29/66636* (2013.01); *H01L 29/66795* (2013.01); *H01L 29/7833* (2013.01); *H01L 29/7848* (2013.01); *H01L 29/665* (2013.01)

(58) Field of Classification Search
USPC .................................. 438/212, 222, 300, 589
See application file for complete search history.

(56) References Cited

U.S. PATENT DOCUMENTS

| | | |
|---|---|---|
| 2005/0095795 A1 | 5/2005 | Son et al. |
| 2008/0265256 A1 | 10/2008 | Lin et al. |
| 2010/0038679 A1 | 2/2010 | Chan et al. |
| 2010/0093147 A1 | 4/2010 | Liao et al. |
| 2010/0109045 A1* | 5/2010 | Liu et al. .................. 257/190 |
| 2010/0164020 A1* | 7/2010 | Kronholz et al. ............ 257/408 |

* cited by examiner

*Primary Examiner* — Fernando L Toledo
*Assistant Examiner* — Valerie N Newton
(74) *Attorney, Agent, or Firm* — Slater & Matsil, L.L.P.

(57) ABSTRACT

A semiconductor device, such as a PMOS or NMOS device, having localized stressors is provided. Recesses are formed on opposing sides of a gate electrode. A stress-inducing region is formed along a bottom of the recess, and a stressed layer is formed over the stress-inducing region. By having a stress-inducing region with a larger lattice structure than the stressed layer, a tensile strain may be created in a channel region of the semiconductor device and may be suitable for an NMOS device. By having a stress-inducing region with a smaller lattice structure than the stressed layer, a compressive strain may be created in the channel region of the semiconductor device and may be suitable for a PMOS device. Embodiments may be applied to various types of substrates and semiconductor devices, such as planar transistors and finFETs.

20 Claims, 8 Drawing Sheets

SEMICONDUCTOR DEVICE WITH A BURIED STRESSOR

This application is a divisional of U.S. patent application Ser. No. 12/750,160, entitled "Semiconductor Device with a Buried Stressor" filed on Mar. 30, 2010, which application is hereby incorporated herein by reference.

TECHNICAL FIELD

This disclosure relates generally to semiconductor devices and, more particularly, to semiconductor devices having a buried stressor and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, strain in the channel is introduced by creating a recess in the substrate in the source/drain regions. For example, a PMOS device having a compressive stress in the channel region may be formed on a silicon substrate by epitaxially growing a stress-inducing layer having a larger lattice structure than the silicon, such as a layer of SiGe, within recessed regions in the source/drain regions. Similarly, an NMOS device having a tensile stress in the channel region may be formed on a silicon substrate by epitaxially growing a stress-inducing layer having a smaller lattice structure than the silicon, such as a layer of SiC, within recessed regions in the source/drain regions.

These other materials such as SiGe and SiC, however, may cause other issues with regard to the device. For example, using these non-Si materials in the source/drain regions may cause challenges in either silicidation or ultra-shallow junction formation. For example, using a Ge layer or a layer of SiGe material having a high percentage of Ge for PMOS devices may cause rapid B diffusion problems, and SiC layers may exhibit dopant deactivation issues. These limitations may create issues with, and possibly prevent, realization of the full potential of the stressor for aggressively scaled devices.

SUMMARY

These and other problems are generally reduced, solved, or circumvented, and technical advantages are generally achieved, by embodiments discussed herein, which provides a strained semiconductor device to improve the operating characteristics of the semiconductor device and a method of manufacture.

In an embodiment, a semiconductor device, such as a planar PMOS or NMOS transistor, having localized stressors is provided. Recesses are formed on opposing sides of a gate electrode. A stress-inducing region is formed along a bottom of the recess, and a stressed layer is formed over the stress-inducing region. By having a stress-inducing region with a larger lattice structure than the stressed layer, a tensile strain may be created in a channel region and may be suitable for an NMOS device. By having a stress-inducing region with a smaller lattice structure than the stressed layer, a compressive strain may be created in the channel region of the semiconductor device and may be suitable for a PMOS device.

In another embodiment, a semiconductor device, such as an NMOS or a PMOS finFET, is provided. A semiconductor fin is recessed and a stress-inducing layer is formed on a top surface of the recessed fin. A stressed fin is formed over the stress-inducing layer. An NMOS finFET having a tensile strain in a channel region may be formed by using a material for the stress-inducing region with a larger lattice structure than the material of the stressed fin, and a PMOS finFET having a compressive strain in the channel region may be formed by using a material for the stress-inducing region with a smaller lattice structure than the material of the stressed fin.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

As will be explained in greater detail below, embodiments utilize a buried stress-inducing layer having a different lattice structure than an overlying layer. The difference in the lattice structure between the stress-inducing layer and the overlying layer will cause the overlying layer to have either a compressive stress or a tensile stress. When used in source/drain regions of a transistor, the stress-inducing layer may be used to create the desired stress in a channel region, while still allowing for silicon in upper surfaces of source/drain regions.

Figure 1:
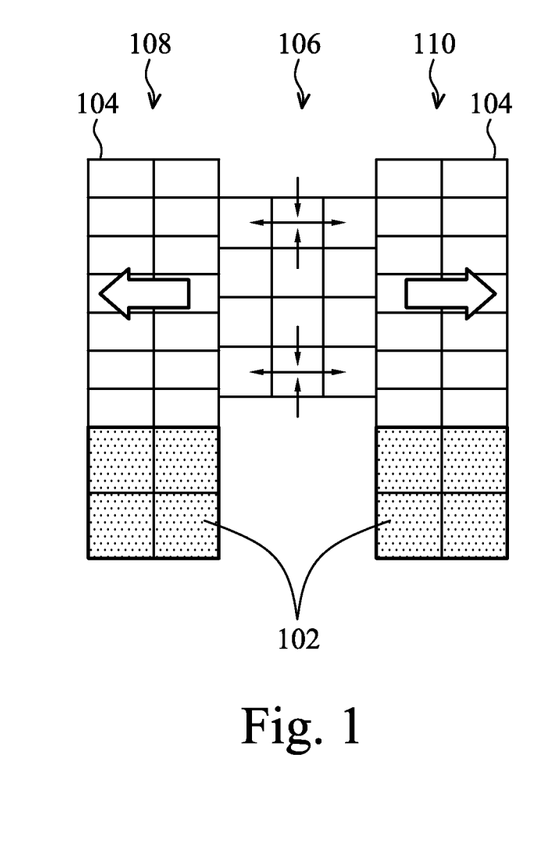
FIG. 1 illustrates a stress-inducing region having a relatively large lattice structure in accordance with an embodiment.

For example, FIG. 1 illustrates an example of an embodiment in which a stress-inducing layer 102 has a lattice structure larger than an overlying stressed layer 104, thereby exerting a tensile stress in a channel region 106 between a source region 108 and a drain region 110. In this example, the stress-inducing layer 102 is placed in the source region 108 and the drain region 110, and the stressed layer 104 is formed over the stress-inducing layer 102. A lattice structure of the stress-inducing layer 102 is larger than a lattice structure of the stressed layer 104. As a result of this difference in the lattice structure, the stressed layer 104 has a tensile stress as the lattice structure of the stressed layer 104 is stretched to match the lattice structure of the stress-inducing layer 102. The tensile stress in the source region 108 and the drain region 110 in turn causes the channel region 106 to have a tensile stress as indicated by the arrows in FIG. 1.

Figure 2:
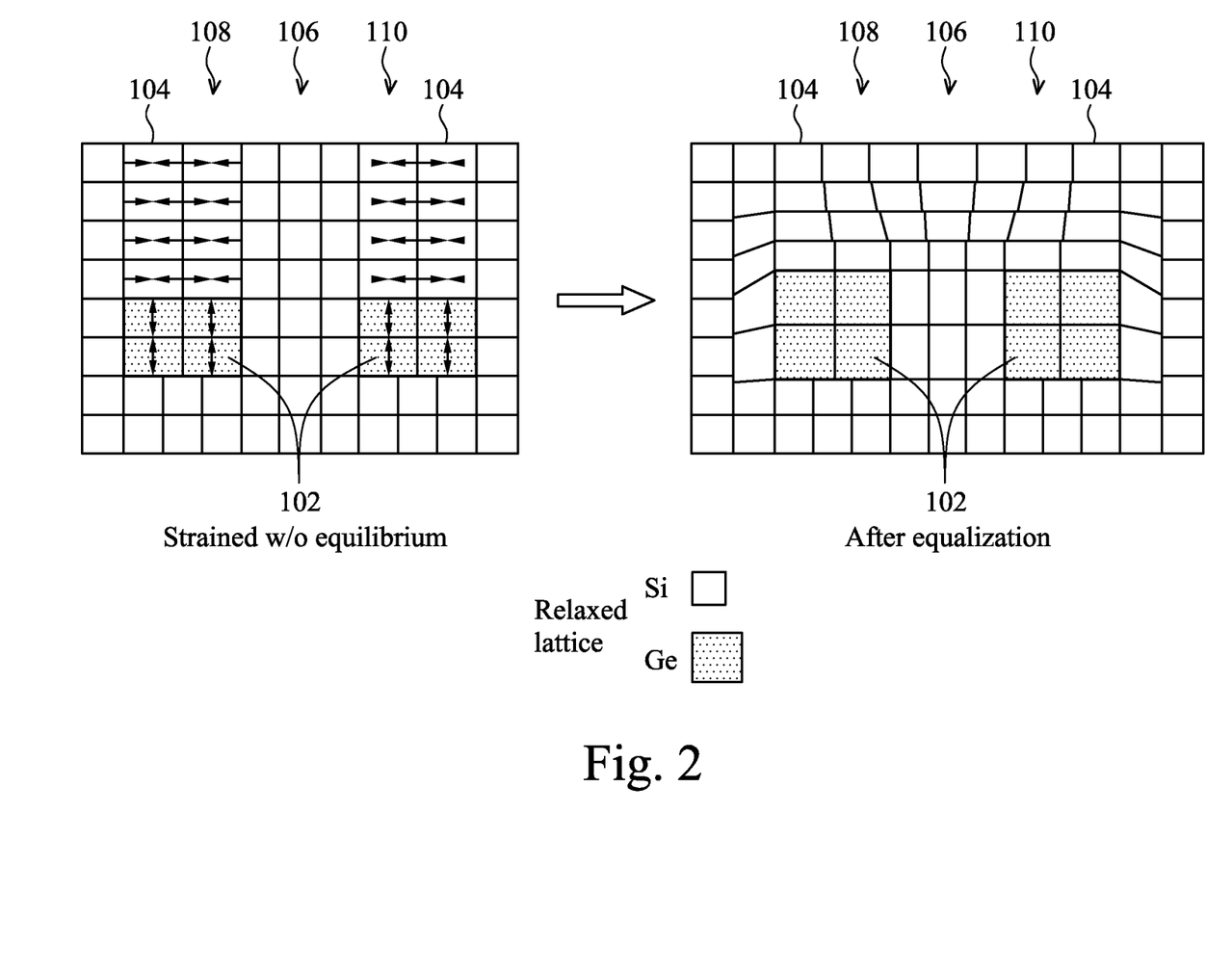
FIG. 2 illustrates a stress-inducing region in equilibrium in accordance with an embodiment.

It should be noted that FIG. 1 illustrates an example that is not at equilibrium for purposes of better illustrating the stress directions. FIG. 2 illustrates an example of the embodiment discussed above with reference to FIG. 1 wherein the lattice structure is shown without equilibrium and after equalization. In this example, Ge is used as an example of a material with a lattice structure larger than the lattice structure of Si.

Figure 3:
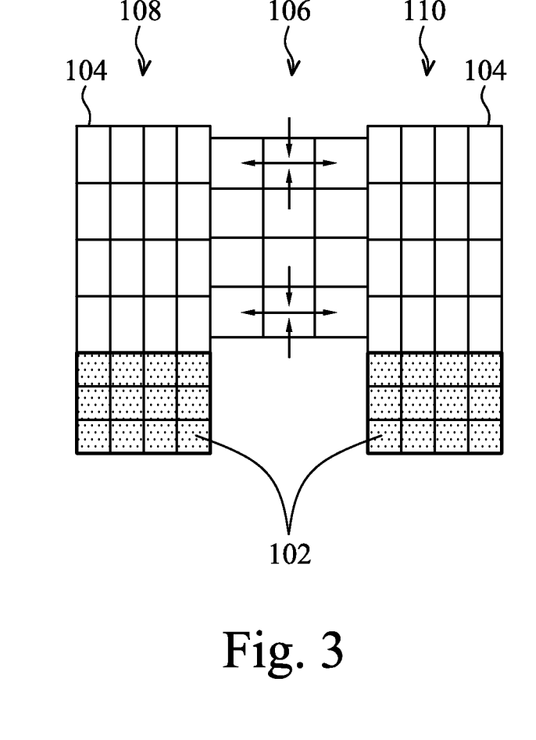
FIG. 3 illustrates a stress-inducing region having a relatively small lattice structure in accordance with an embodiment.

While FIG. 1 illustrates an example in which the channel region 106 has a tensile stress, which is suitable for an NMOS device, FIG. 3 illustrates an example of an embodiment in which the channel region 106 has a compressive stress, which may be more suitable for a PMOS device. In this example, the stress-inducing layer 102 has a smaller lattice structure than the lattice structure of the overlying stressed layer 104. This difference will cause a compressive stress in the stressed layer 104 as the lattice structure of the stressed layer 104 is compressed to match the lattice structure of the stress-inducing layer 102. This compressive stress in the source region 108 and the drain region 110 causes the channel region 106 to have a compressive stress as indicated by the arrows in FIG. 3. It should be noted that FIG. 2, one case illustrates an example that is not at equilibrium for purposes of illustration to better illustrate the stress directions.

Figure 4:
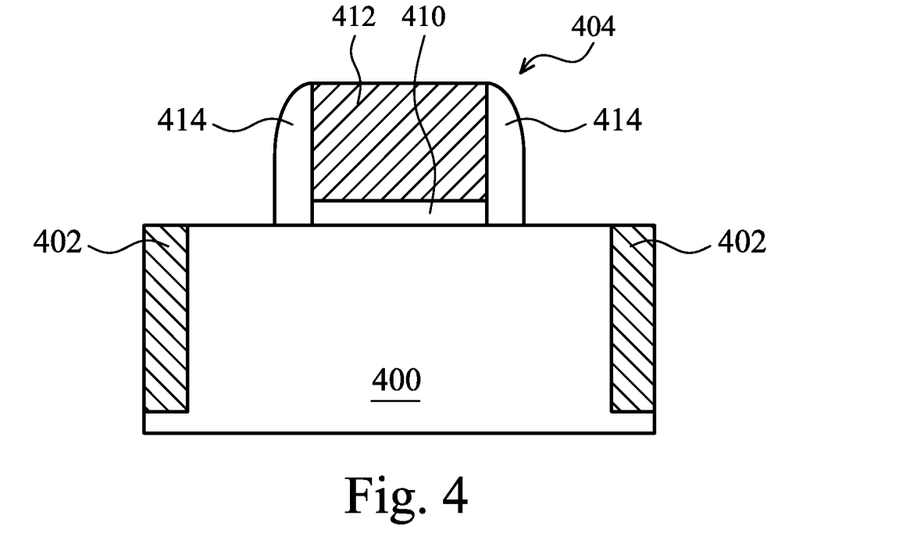
FIGS. 4-8 illustrate various process steps of fabricating a semiconductor device having a stressed channel region in accordance with an embodiment.

FIGS. 4-8 illustrate a method for fabricating a semiconductor device having a strained channel region in accordance with an embodiment. Referring first to FIG. 4, a portion of a substrate 400 having isolation regions 402 formed therein is shown in accordance with an embodiment. The substrate 400 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. The substrate may alternatively be a Ge substrate, a SiGe substrate, a group III-V substrate, or the like.

The isolation regions 402, such as insulator-filled shallow trench isolations, may be formed in an area of substrate 400 where physical isolation of the MOSFET regions is desired. The isolation regions 402 may comprise silicon oxide deposited by chemical vapor deposition (CVD) techniques. Other isolation structures, such as a thermally grown field oxide (FOX) region or the like, and other materials may also be used.

FIG. 4 further illustrates a gate structure 404 comprising a gate insulator layer 410, a gate electrode 412, and spacers 414 formed and patterned on the substrate 400. The gate insulator layer 410 may be formed of a high-K dielectric material, such as silicon oxide, silicon oxynitride, silicon nitride, an oxide, a nitrogen-containing oxide, a combination thereof, or the like. In embodiment, the gate insulator layer 410 has a relative permittivity value greater than about 4. Other examples of such materials include aluminum oxide, lanthanum oxide, hafnium oxide, zirconium oxide, hafnium oxynitride, or combinations thereof.

In an embodiment in which the gate insulator layer 410 comprises an oxide layer, the gate insulator layer 410 may be formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. The gate insulator layer 410 is about 10 Å to about 50 Å in thickness.

The gate electrode 412 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode is poly-silicon, the gate electrode 412 may be formed by depositing doped or undoped poly-silicon by low-pressure CVD (LPCVD) to a thickness in the range of about 200 Å to about 1000 Å.

The gate insulator layer 410 and the gate electrode 412 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate insulator layer 410 and the gate electrode 412 as illustrated in FIG. 4. In an embodiment in which the gate electrode material is poly-crystalline silicon and the gate dielectric material is an oxide, the etching process may be a wet or dry, anisotropic or isotropic, etch process.

FIG. 4 also illustrates the formation of spacers 414. As is known in the art, to form spacers 414, a gate spacer layer (not shown) is first formed. In an embodiment, the gate spacer layer includes a nitride layer on an oxide layer. In alternative embodiments, the gate spacer layer may include a single layer or more than two layers, each comprising oxide, silicon nitride, silicon oxynitride (SiON), and/or other dielectric materials. The gate spacer layer may be formed using commonly used techniques, such as plasma enhanced CVD (PECVD), low-pressure CVD (LPCVD), sub-atmospheric CVD (SACVD), and the like. The gate spacer layer is then patterned to form spacers 414, wherein the patterning may be performed by either wet etching or dry etching. Horizontal portions of the spacer layer are removed, and the remaining portions form spacers 414.

Figure 5:
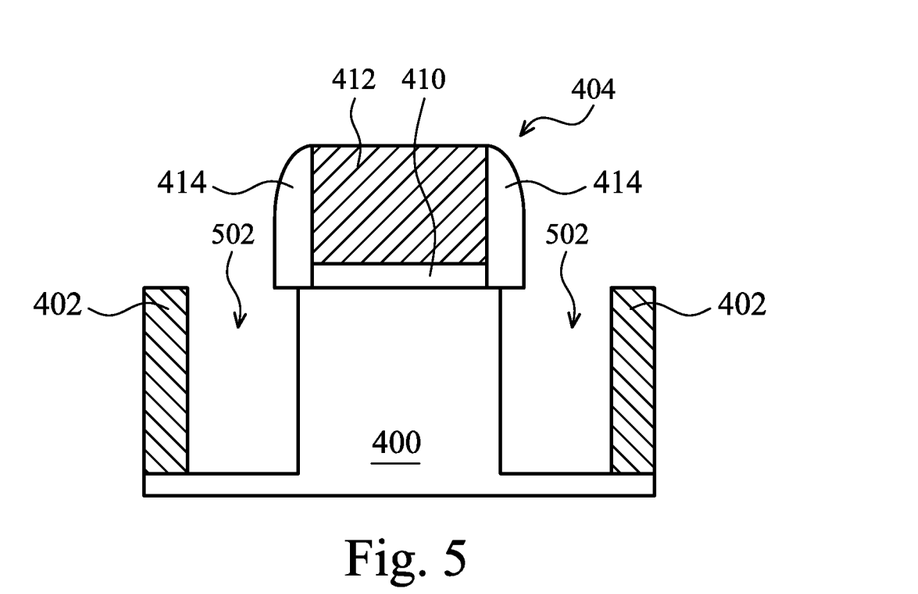

Referring to FIG. 5, recesses 502 are formed on opposing sides of the gate electrode 412. As discussed in greater detail below, a stress-inducing layer will be epitaxially grown along the bottom of the recesses 502, and a stressed layer will be epitaxially grown over the stress-inducing layer. In accordance with an embodiment, the recesses 502 have a depth such that the stress-inducing layer can be grown to a thickness sufficient to result in a surface free of dislocations due to lattice mismatch between the stress-inducing layer and the material of the underlying substrate. In this manner, the surface of the stress-inducing layer will be relaxed, thereby having a lattice structure substantially close to its intrinsic lattice structure.

For example, in an embodiment, recesses 502 may be etched by, for example, $HBr/O_2$, $HBr/Cl_2/O_2$, or $SF_6/Cl_2$ plasma to a depth between about 400 Å and about 3000 Å. One skilled in the art will realize that the dimensions provided throughout the description are merely examples, and the dimensions may vary with the scaling of the technology used for forming the integrated circuits.

Figure 6:
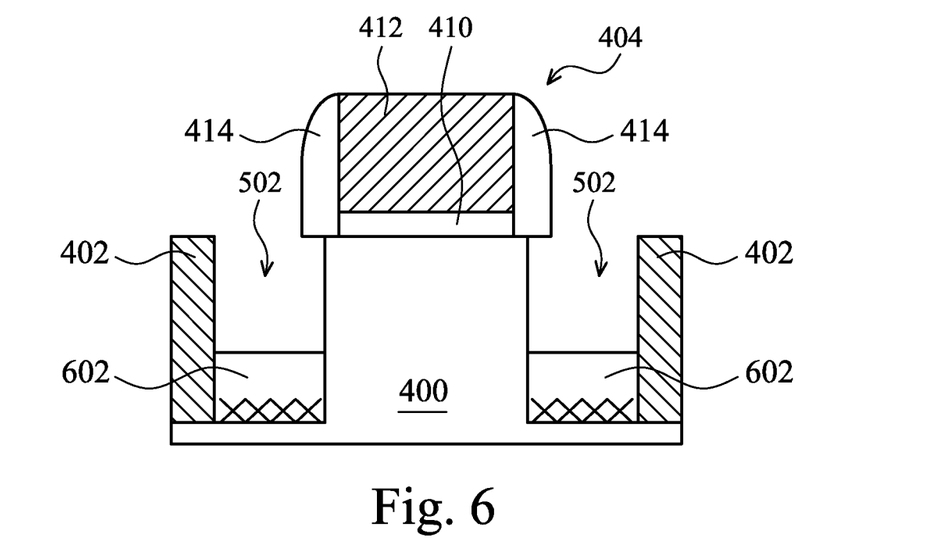

FIG. 6 illustrates the formation of stress-inducing regions 602 along the bottoms of the recesses 502. In an embodiment, the stress-inducing regions 602 are formed to a thickness such that surface of the stress-inducing regions 602 are free from dislocations as a result of the lattice mismatch between the material of the stress-inducing regions 602 and the material of the underlying substrate 400, thereby resulting in stress-inducing regions 602 having a surface with a relaxed intrinsic lattice structure. As a result, the thickness of the stress-inducing regions 602 may be varied depending on the types of materials used.

Figure 7:
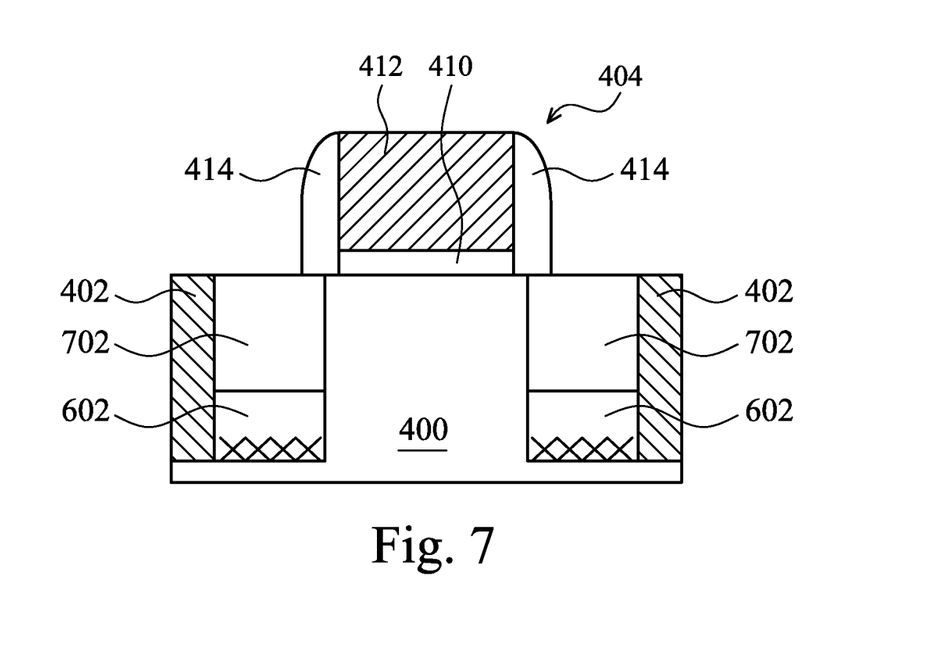

FIG. 7 illustrates formation of stressed regions 702 overlying the stress-inducing regions 602 in accordance with an embodiment. The material of the stressed regions 702 is selected such that a lattice mismatch exists between the material of the stress-inducing regions 602 and the material of the stressed regions 702. One of ordinary skill in the art will also appreciate that the type of materials may be varied depending upon the type of device being formed. For example, in forming an NMOS device, the stress-inducing regions 602 may be formed of SiGe and the stressed regions 702 may be formed of silicon, which has a smaller lattice structure than SiGe. The lattice structure of the SiGe stress-inducing regions 602 causes a tensile stress in the stressed regions 702, which in turn causes a tensile strain in the channel region, thereby increasing the electron mobility. SiGe stress-inducing regions 602 may be epitaxially grown in a selective epitaxial growth (SEG) process such as CVD using Si-containing gases and Ge-containing gases, such as $SiH_4$ and $GeH_4$, respectively, as precursors. Overlying silicon stressed regions 702 may be epitaxially grown in a SEG process such as CVD using Si-containing gases, such as $SiH_4$, as precursors.

In another example for forming a PMOS device, the stress-inducing regions 602 may be formed of SiC and the stressed regions 702 may be formed of silicon, which has a larger lattice structure than SiC. The lattice structure of the SiC stress-inducing regions 602 causes a compressive stress in the stressed regions 702, which in turn causes a compressive strain in the channel region, thereby increasing the hole mobility. SiC stress-inducing regions 602 may be epitaxially grown in a SEG process such as CVD using Si-containing gases, such as $SiH_4$, and C-containing gases, such as $C_2H_4$ or $C_2H_6$, as precursors. Overlying silicon stressed regions 702 may be epitaxially grown in a SEG process such as CVD using Si-containing gases, such as $SiH_4$, as precursors.

It should also be noted that other materials may be used for the substrate 400, the stress-inducing regions 602, and the stressed regions 702. For example, substrates and/or the stressed region may be formed of SiGe, Ge, a Group III-V material, or the like. In this example, the stress-inducing regions 602 may be formed of a material such as SiGe, Ge, or the like which have a lattice structure larger than that of the stressed region for an NMOS device and a material such as Si, SiC, or the like which have a lattice structure smaller than that of the stressed region for a PMOS device.

It should be noted that the stressed regions 702 are illustrated to have an upper surface even with a bottom surface of the gate insulator layer 410 for illustrative purposes only, and as such, the stressed regions 702 may alternatively be raised above or recessed below the bottom surface of the gate insulator layer 410. It should further be noted that part or all of one or both of the stress-inducing regions 602 and the stressed regions 702 may be in situ doped with impurities. For example, an NMOS device may be formed by doping the stress-inducing regions 602 and/or the stressed regions 702 with N-type impurities such as arsenic or phosphorous, and a PMOS device may be formed by doping the stress-inducing regions 602 and/or the stressed regions 702 with P-type impurities such as boron. Alternatively, the stress-inducing regions 702 may be doped with dopants of polarity opposite to that of the stressed regions 702, to help control short channel effect and improve isolation.

As one of ordinary skill in the art will appreciate, embodiments such as those discussed above allow for a different material to be used in the source/drain regions than the layer causing the stress. In these embodiments, the stress-inducing regions 602 are buried beneath the stressed regions 702. This allows the material used in the stressed regions 702 to vary from the material used to actually induce the strain, e.g., the stress-inducing regions 602. As a result, materials such as silicon may be used in the source/drain regions, allowing well-developed silicidation and Si-junction formation technology to be readily applied on the stressed regions 702. Such a feature allows the strain in the channel region to be adjusted by altering the type of material and the characteristics of the stress-inducing regions 602, without necessarily altering subsequent processing steps.

Figure 8:
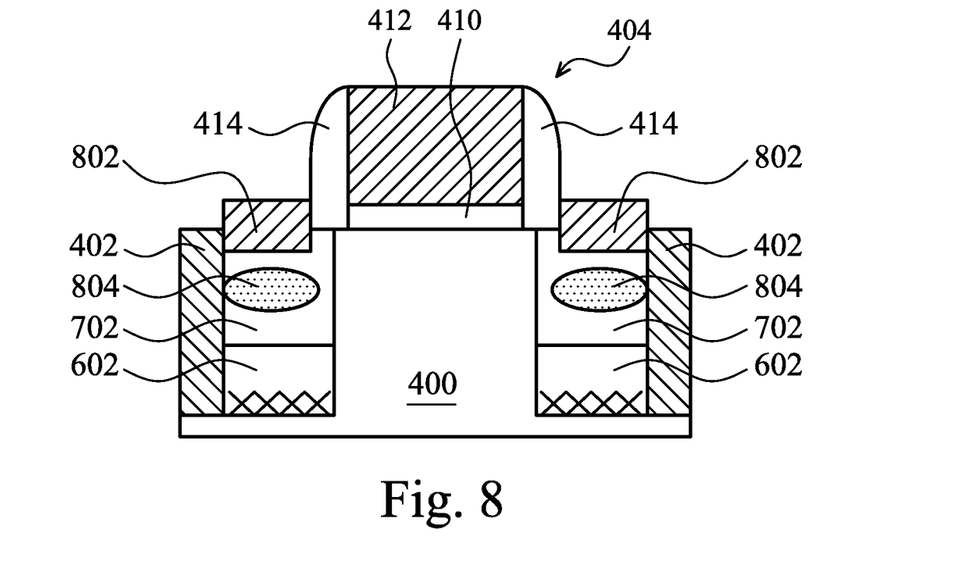

FIG. 8 illustrates the formation of source/drain regions 804 and silicide regions 802 in accordance with an embodiment. It should be noted that the source/drain regions are generally represented by ovals. One of ordinary skill in the art will realize that embodiments disclosed herein may be used with any suitable source/drain doping profile, including any suitable use of spacers, liners, and/or sacrificial liners/spacers. For example, lightly-doped drains (LDD) may be formed prior to recessing the substrate 400; the heavily-doped regions may be formed in situ or after formation of the stressed regions 702 with the use of the spacers 414 and/or different spacers and/or additional spacers. As another example, both the LDD and the heavily-doped regions may be formed after forming recesses by, for example, in situ, implantation, diffusion, or the like.

As is known in the art, silicide regions 802 may be formed by blanket depositing a thin layer of metal, such as nickel, platinum, cobalt, and combinations thereof. The substrate is then heated, causing the silicon to react with the metal where contacted. After the reaction, a layer of metal silicide is formed. The un-reacted metal is selectively removed through the use of an etchant that attacks metal but does not attack silicide.

It should also be noted that the location of the recesses 502 may be varied. For example, the recesses may be offset from, aligned with, or extend under the gate electrode 412.

Thereafter, subsequent processing techniques well-known in the art may be performed to complete the device. For example, one or more dielectric layers and metallization layers may be formed, as well as back-end of line (BEOL) processing techniques suitable for the particular application may be performed.

Figure 9:
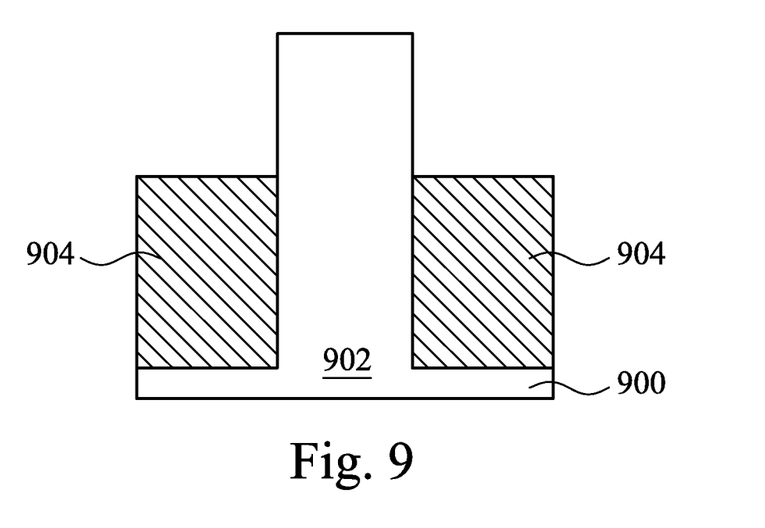
FIGS. 9-13 illustrate various process steps of fabricating a semiconductor device having a stressed channel region in accordance with another embodiment.

FIGS. 9-13 illustrate a method for fabricating a semiconductor device having a strained channel region in a finFET device in accordance with an embodiment. Referring first to FIG. 9, a portion of a substrate 900 having a fin 902 extending between isolation regions 904 is shown in accordance with an embodiment. The substrate 900 may comprise bulk silicon, doped or undoped, or an active layer of an SOI substrate. The substrate may alternatively be a Ge substrate, a SiGe substrate, a group III-V substrate, or the like. Other substrates, such as a multi-layered or gradient substrate may also be used. The insulator layer may be, for example, a silicon oxide layer.

Figure 10:
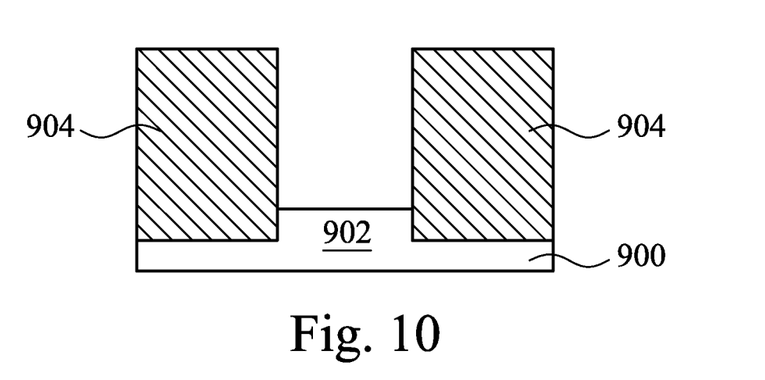

As illustrated in FIG. 10, the fin 902 is recessed using, for example, an anisotropic etch process. As discussed in greater detail below, part of the fin is removed and replaced with a stress-inducing layer, upon which the fin will be reformed. In accordance with an embodiment, the fin is recessed to a depth such that the stress-inducing layer can be grown to a thickness sufficient to result in a surface free of dislocations due to lattice mismatch between the stress-inducing layer and the material of the underlying substrate. In this manner, the surface of the stress-inducing layer will be relaxed, thereby having its intrinsic lattice structure. For example, in an embodiment, the fin 902 is recessed by, for example, etching using $HBr/O_2$, $HBr/Cl_2/O_2$, or $SF_6/Cl_2$ plasma to a depth between about 400 Å and about 3000 Å.

Figure 11:
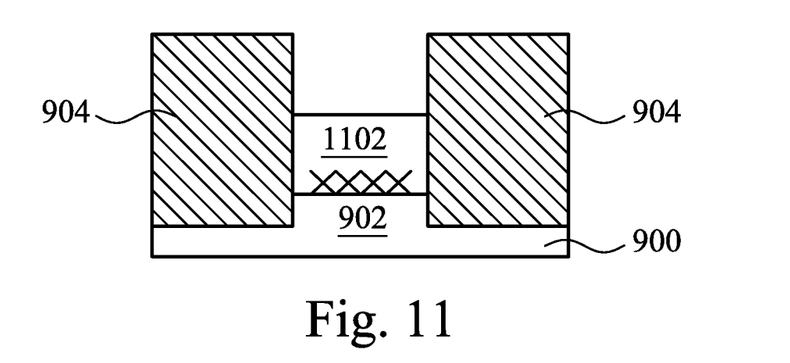

FIG. 11 illustrates forming a stress-inducing region 1102. The stress-inducing region 1102 may be formed in a similar manner using similar materials as discussed above with reference to the stress-inducing regions 602 and FIG. 6.

Figure 12:
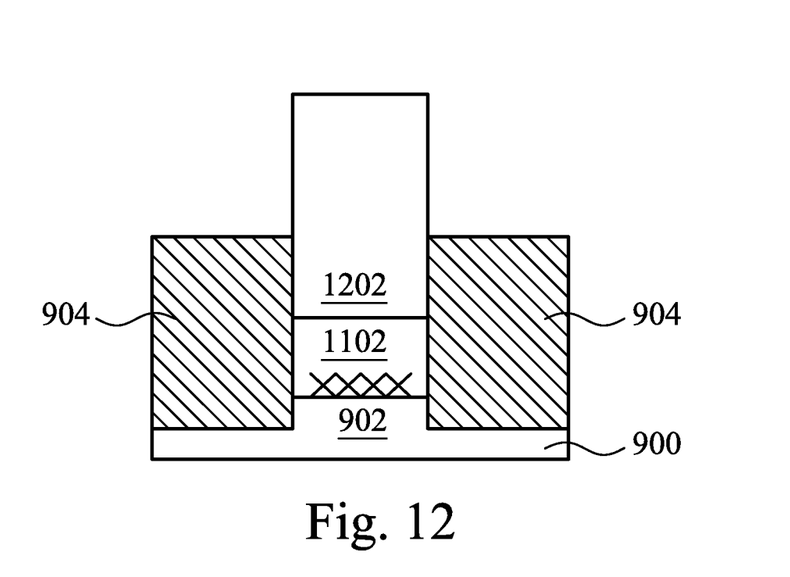

Thereafter, as illustrated in FIG. 12, a stressed fin 1202 may be formed overlying the stress-inducing region 1102. The stressed fin 1202 may be formed of similar materials using similar techniques as discussed above with reference to the stressed regions 702 and FIG. 7. However, in this embodiment, the stressed fin 1202 is formed to a height above the isolation regions 904. In an embodiment, the stressed fin 1202 extends between about 200 Å and about 1000 Å above the isolation regions 904.

It should be noted that other layers may be used to form the stressed fin 1202. For example, a mask layer may be formed over the isolation regions 904 to aid in the shaping of the stressed fin 1202, preventing or reducing the amount the stressed fin 1202 extends over a top surface of the isolation regions 904 during formation.

Figure 13:
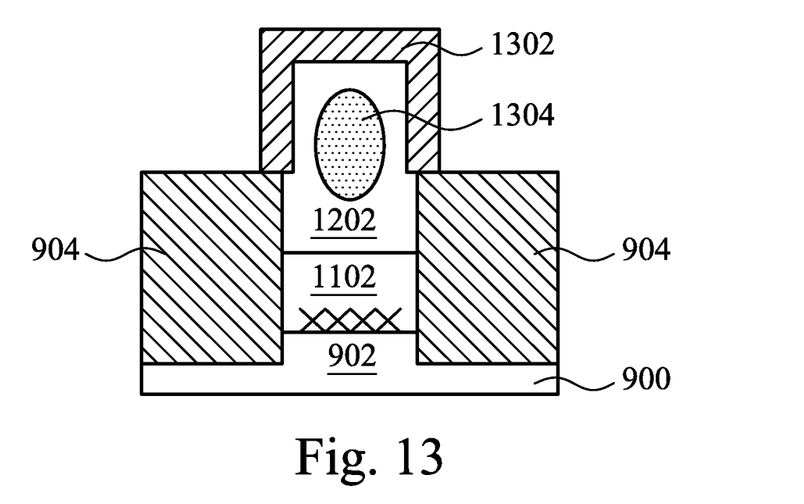

FIG. 13 illustrates the formation of source/drain regions 1304 and silicide regions 1302 in accordance with an embodiment. It should be noted that the source/drain regions 1304 are generally represented by ovals. One of ordinary skill in the art will realize that embodiments disclosed herein may be used with any suitable source/drain doping profile, including any suitable use of spacers, liners, and/or sacrificial liners/spacers.

It should be noted that FIGS. 9-13 illustrate an embodiment in which the source/drain regions of the fin are removed and replaced with an underlying stress-inducing region 1102. In other embodiments, however, the channel region may be recessed without recessing the source/drain regions. In this embodiment, the processes discussed above with respect to FIGS. 9-12 are performed in the channel region. Furthermore, in another embodiment, the entire fin (e.g., both the channel region and the source/drain regions) is recessed. In this embodiment, the source/drain regions are formed as discussed above with reference to FIGS. 9-13 and the channel region is formed as discussed above with reference to FIGS. 9-12. It will be appreciated that in embodiments in which the channel region of the fin is being replaced, the doping may vary.

Thereafter, subsequent processing techniques well-known in the art may be performed to complete the device. Other processes may include forming a gate insulator, gate electrode, source/drain regions, one or more dielectric layers and metallization layers, BEOL processing, and the like.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a substrate;
    a gate electrode on the substrate;
    source/drain regions on opposing sides of the gate electrode, the source/drain regions each comprising a stress-inducing region and a stressed region overlying the stress-inducing region, an uppermost surface of the stress-inducing region being completely covered by the stressed region, the stressed region being a semiconductor material, the stress-inducing region being a different material than the substrate and the stressed region, the uppermost surface of the stress-inducing region having a lattice structure substantially close to an intrinsic lattice structure of the different material; and
    a spacer along a sidewall of the gate electrode, wherein the spacer directly overlays at least a portion of the stressed region.

2. The device of claim 1, wherein the stress-inducing region has a lattice structure larger than the stressed region, and wherein portions of the source/drain regions are portions of an NMOS device.

3. The device of claim 1, wherein the stress-inducing region has a lattice structure smaller than the stressed region, and wherein portions of the source/drain regions are portions of a PMOS device.

4. The device of claim 1, wherein the stress-inducing region has a conductivity opposite the stressed region.

5. The device of claim 1, wherein the gate electrode is a portion of a finFET.

6. The device of claim 1, wherein the gate electrode is a portion of a planar transistor.

7. A method of forming a device, the method comprising:
    providing a substrate;
    forming a gate electrode over the substrate;
    forming recesses in the substrate on opposing sides of the gate electrode;
    forming a stress-inducing region along a bottom of the recesses; and
    forming a stressed region over the stress-inducing region, the stressed region extending an entire width of the recesses, wherein the stress-inducing region has a thickness such that an upper surface of the stress-inducing region is relaxed, the upper surface of the stress-inducing region having a lattice structure substantially close to an intrinsic lattice structure of a material forming the stress-inducing region.

8. The method of claim 7, wherein the stress-inducing region has a lattice structure larger than the stressed region.

9. The method of claim 8, wherein the device is an NMOS device.

10. The method of claim 7, wherein the stress-inducing region has a lattice structure smaller than the stressed region.

11. The method of claim 10, wherein the device is a PMOS device.

12. The method of claim 7, wherein the stress-inducing region and the stressed region are different conductivity types.

13. The method of claim 7, wherein forming the stressed region comprises epitaxially growing a layer comprising silicon.

14. The method of claim 7, wherein the stress-inducing region has a surface free of dislocations due to lattice mismatch between the stress-inducing region and the substrate.

15. A semiconductor device comprising:
source/drain regions disposed in a substrate and on opposing sides of a gate electrode;
a channel region disposed in the substrate under the gate electrode and between the source/drain regions;
a plurality of buried stress-inducing regions, one of the plurality of buried stress-inducing regions disposed within each of the source/drain regions; and
a plurality of stressed regions, one of the plurality of stressed regions disposed within each of the source/drain regions and overlying a respective buried stress-inducing region, each of the plurality of stressed regions extending to the channel region;
wherein an upper surface of the each of the plurality of buried stress-inducing regions is completely covered by a respective overlying stressed region, and wherein the upper surface of each of the plurality of buried stress-inducing regions has a lattice constant substantially equal to an intrinsic lattice constant of a respective material of each of the plurality of buried stress-inducing regions; and
wherein the channel region is substantially free of an underlying stress-inducing region.

16. The semiconductor device of claim 15, wherein the plurality of buried stress-inducing regions has a lattice structure different than the plurality of stressed regions.

17. The semiconductor device of claim 15, wherein each of the plurality of stressed regions are a semiconductor material, and wherein the plurality of buried stress-inducing regions is a different material than the substrate and the plurality of stressed regions.

18. The semiconductor device of claim 17, wherein the plurality of stressed regions, the channel region and the substrate are a same material.

19. The semiconductor device of claim 18, wherein the plurality of stressed regions, the channel region and the substrate comprise silicon and the plurality of buried stress-inducing regions comprise germanium.

20. The semiconductor device of claim 15, wherein each of the plurality of buried stress-inducing regions is in contact at a bottom side with the substrate and in contact at a top side with one of the plurality of stressed regions.

* * * * *